(12) United States Patent
Pappas et al.

(10) Patent No.: US 6,649,323 B2
(45) Date of Patent: *Nov. 18, 2003

(54) OVERCOAT FOR LIGHT-SENSITIVE MATERIALS COMPRISING (1-VINYLIMIDAZOLE) POLYMER OR COPOLYMER

(75) Inventors: Socrates Peter Pappas, Juno Beach, FL (US); Harald Baumann, Osterode (DE); Udo Dwars, Herzberg (DE); Celin M. Savariar-Hauck, Badenhausen (DE); Hans-Joachim Timpe, Osterode (DE)

(73) Assignee: Kodak Polychrome Graphics LLC, Norwalk, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 129 days.

(21) Appl. No.: 09/489,414

(22) Filed: Jan. 21, 2000

(65) Prior Publication Data

US 2002/0010264 A1 Jan. 24, 2002

Related U.S. Application Data

(63) Continuation of application No. PCT/EP98/04765, filed on Jul. 30, 1998.

(30) Foreign Application Priority Data

Jul. 30, 1997 (DE) .......................... 197 32 902

(51) Int. Cl.$^7$ .............................. G03F 7/028
(52) U.S. Cl. .................. 430/271.1; 428/409; 428/500; 428/522; 428/473.5; 430/273.1; 430/281.1; 430/283.1; 430/284.1; 430/285.1; 430/286.1; 430/302; 525/57
(58) Field of Search .................. 525/57; 428/409, 428/473.5, 500, 522; 430/271.1, 273.1, 284.1, 281.1, 283.1, 285.1, 286.1, 302

(56) References Cited

U.S. PATENT DOCUMENTS

| | | | | |
|---|---|---|---|---|
| 5,506,089 A | * | 4/1996 | Gybin et al. | 430/287 |
| 5,633,127 A | * | 5/1997 | Nair et al. | 430/496 |
| 5,696,193 A | * | 12/1997 | Daniel et al. | 524/408 |
| 5,800,974 A | * | 9/1998 | Wallis et al. | 430/556 |
| 5,919,850 A | * | 7/1999 | Wang et al. | 524/167 |

FOREIGN PATENT DOCUMENTS

EP 0275147 7/1988

OTHER PUBLICATIONS

WPI Derwent Abstract 98–489036 of JP10211764, Aug. 11, 1988.

* cited by examiner

*Primary Examiner*—Judy M. Reddick
(74) *Attorney, Agent, or Firm*—Faegre & Benson LLP

(57) ABSTRACT

A lithographic printing plate precursor comprises a substrate, a free radical polymerizable photosensitive layer comprising a light-sensitive composition on the substrate, and a water-soluble overcoat layer on the photosensitive layer, wherein the overcoat layer comprises polyvinyl alcohol, and a further component that is not amphoteric and is poly(1-vinylimidazole) or a copolymer of 1-vinylimidazole and at least one further monomer. The photosensitive layer comprises a free radical polymerizable component and a photoinitiator.

39 Claims, No Drawings

OVERCOAT FOR LIGHT-SENSITIVE MATERIALS COMPRISING (1-VINYLIMIDAZOLE) POLYMER OR COPOLYMER

CROSS-REFERENCE TO RELATED APPLICATION

This application is a continuation of International Application No. PCT/EP98/04765, which was published in English on Jul. 30, 1998, and which in turn claims priority from German Patent Application No. DE 19732902.0 filed in Germany on Jul. 30, 1997.

Water-soluble polymers are used as temporary coatings on organic light-sensitive substrates, for example in the manufacture of lithographic printing plates, letterpress plates, litho plates for screen printing, printed boards and in etching molded parts and the like.

In the above-mentioned uses, the water-soluble polymers have the function of protecting the substrate from aerial oxygen during storage, exposure and in particular during the time between exposure and further processing (development and the like). During that time period the temporary coating has to exhibit a sufficient adhesion to the light-sensitive substrate so that safe handling (manufacture, packing, transport, exposure etc.) is guaranteed without tearing of the layers. On the other hand, the temporary layer has to be easy to remove prior to the development, preferably by washing with water.

A great number of water-soluble polymers was tested in practice. It was found that polymers such as polyvinyl alcohol, partly saponified polyvinyl acetate which can also contain vinylether and vinylacetal units, polyvinyl pyrrolidone and copolymers thereof with vinyl acetate and vinyl ethers, hydroxy alkyl cellulose, gelatin, polyacrylic acid, gum arabic, polyacryl amide, dextrin, copolymers of alkylvinyl ethers and maleic acid anhydride as well as water-soluble high molecular polymers of ethylene oxide having molecular weights of above 5,000 are particularly suitable. This is due to the low oxygen permeability of these polymers, cf. measured values in K. Petrak, E. Pitts, J. Appl. Polym. Sci. 25 (1980) pages 879–886. Polyvinyl alcohol is mentioned as being particularly suitable.

However, many of the polymers prove to be insufficient regarding their adherence to organic, light-sensitive substrates. For example, polyvinyl alcohol layers can easily be removed over large areas by means of adhesive tapes, or in cutting substrates coated with polyvinyl alcohols the water-soluble protective coating often peels off at the edges of the cut.

Furthermore, it was found that some water-soluble polymers used as overcoats affect certain properties of the light-sensitive layers. These properties include light-sensitivity, resolution, thermal stability in storage and the influence on the ability to take on colors when the light-sensitive layer is used as a printing plate.

Therefore, many tests were carried out in order to improve the properties of the water-soluble protective layers on organic light-sensitive substrates.

In practice, polyvinyl alcohol is often used in combination with polyvinyl pyrrolidone as adhesive. However, adhesion is low if low amounts of polyvinyl pyrrolidone are used and if higher amounts of polyvinyl pyrrolidone are used in order to guarantee a sufficient degree of adhesion, the impermeability and light-sensitivity of the layers are reduced.

U.S. Pat. No. 3,458,311 describes the coating of the water-soluble overcoat in the presence of a solvent miscible with water for the provision of adhesion. However, improved adhesion can only be achieved to a minor extent since in the case of the required high contents of solvents, components of the light-sensitive layers are easily removed which considerably impairs the function of this layer.

U.S. Pat. Nos. 4,072,527 and 4,072,528 disclose that in addition to the overcoat polymers dissolved in water, water-insoluble polymers are dispersed. However, the overcoats produced therefrom have the disadvantage that their removability in particular in water or aqueous developers is reduced. Furthermore, the shelf life and the impermeability to aerial oxygen are reduced.

In EP-A-275 147 amphoteric compounds are described as additives to water-soluble layers. However, the adhesion of the overcoats prepared in this manner is too low.

In EP-A-403 096 overcoats are described which contain a maximum of 20 wt.-% of photo initiators. According to this process, however, only water-soluble initiators can be introduced into the overcoat. Furthermore, the adhesion and thermal stability of the systems are not improved.

A similar situation arises when antihalation dyes are introduced into the overcoat according to EP-A-354 475 or polymerization inhibitors according to EP-A-465 034. The slightly improved sharpness of the layers is achieved while the light-sensitivity of the layers is reduced and the poor adhesion of the overcoats remains the same.

EP-A-352 630 describes the combination of a water-soluble polymer having a low aerial oxygen permeability and an aerial oxygen-binding water-soluble polymer. In this patent application, polymers with aliphatic amino groups, preferably of the polyalkyleneimine-type, are mentioned as aerial oxygen-binding polymers. However, such combinations prove to be unsuitable for practical use since this type of amino group-containing polymer exhibits a strong tendency to absorption at the surface of the photopolymer. Therefore, the surface of the photopolymer remains hydrophilic even after the developments which results in a poor ink receptivity in the printing process.

It is the object of the present invention to provide novel water-soluble layers which not only exhibit favorable oxygen-impermeability properties but also an improved adhesion to organic substrates.

Another object of the invention is the use of such water-soluble layers as oxygen-impermeable overcoats on light-sensitive compositions.

In particular, it is the object of the present invention to apply the water-soluble layers as temporary oxygen-impermeable overcoats on light-sensitive printing plate layers and at the same time to obtain a high degree of light-sensitivity of these materials independent of the external air pressure, a high resolution and a high degree of storage stability in combination with a favorable ink receptivity after the developing step.

According to the invention, this object is achieved by the use of water-soluble layers containing polyvinyl alcohol and either poly(1-vinylimidazole) (in the following referred to as PVI) or a copolymer of 1-vinylimidazole and at least one further monomer (in the following referred to as PVI copolymer). Among the PVI copolymers, those are preferred which comprise 10 to 98 mol-% 1-vinylimidazole.

The particular advantage of the overcoats according to the present invention is their extremely good adhesion to organic substrates. This adhesion is especially strong when the organic substrates contain polar groups such as carboxyl groups. The good adhesion of the overcoats on organic substrates is above all due to the content of 1-vinylimidazole units.

It was found that, contrary to many other additives to polyvinyl alcohol layers, large amounts of PVI or PVI copolymer can be used without entailing disadvantages for other properties of the layer (in particular the oxygen impermeability). This finding is all the more surprising because poly(1-vinylimidazole) by itself shows a high degree of oxygen permeability cf. measured values in K. Petrak, E. Pitts, J. Appl. Polym. Sci. 25 (1980) pages 879–886. Furthermore, layers consisting of polyvinyl alcohol and PVI or PVI copolymer show an extraordinarily good adhesion to organic light-sensitive compositions. During the developing step of the light-sensitive systems, the layers are removed residue-free with water or aqueous developing solutions so that e.g. no negative properties such as impaired ink receptivity are entailed if the processed layers are used as printing molds.

The concentration of the PVI or PVI copolymers is preferably 5 to 80 wt.-% based on the dry layer. Especially preferred are 5 to 40 wt.-%; most preferred are 10 to 25 wt.-%.

PVI and PVI copolymers are principally known. They can easily be obtained by radical polymerization of 1-vinylimidazole or 1-vinylimidazole and the second comonomer and a free radical-forming initiator. If water-soluble initiators are used in the polymerization in an aqueous solution, the polymer solution can be introduced to the coating preparations without the additional step of isolating the polymers in solid form.

Another favorable method for the preparation of PVI or PVI copolymers is the radical polymerization in solvents wherein the monomers dissolve and the PVI or the PVI copolymer precipitate. For such a precipitation polymerization ketones such as 2-butanone or alcohols such as isopropanol are suitable. In order to increase the yield of the polymerization, a nonpolar solvent can be added in such an amount that the monomer remains dissolved but the precipitation of PVI or PVI copolymers takes place to an increased extent. For instance, by means of the combination of 2-butanone and hexane or corresponding naphtha fractions it is possible to increase the yield of PVI or PVI copolymers.

A number of compounds is suitable as comonomers for 1-vinylimidazole in the preparation of the PVI copolymers. If the comonomer has hydrophilic properties, an especially high amount of comonomers can be introduced into the PVI copolymer without markedly decreasing water-solubility. Such comonomers include for example vinylpyrrolidone, vinyl alcohol, vinyl acetate, vinylalkylether, hydroxyalkylacrylate, vinyl acetamide, vinyl formamide, acrylonitrile, acrylamide, methacrylamide or vinylamine. In order to maintain water-solubility, the amount of hydrophobic monomers in the PVI copolymers has to remain low. However, hydrophobic comonomers in the PVI copolymers can contribute to the decrease in water-vapor permeability. In some light-sensitive compositions, this leads to an increased storage stability of the materials.

By means of purposeful optimization, required properties can be tailored to fit certain applications.

The polyvinyl alcohols used for the preparation of the oxygen-impermeable protective layers are commercially available at inexpensive prices. They usually have a residual content of acetate group in the range of 0.1 to 30 wt.-%. Especially preferred are polyvinyl alcohols obtained from polyvinylacetate with a residual acetate content of 1.5 to 22 wt.-%. By means of the molecular weight of the used polyvinyl alcohols, adhesion and water-solubility of the overcoats according to the present invention can be controlled. A lower molecular weight promotes the removal of the overcoat with water or, if the overcoat was applied to printing plates, with aqueous alkaline developer chemicals. The used polyvinyl alcohols exhibit viscosities of between 2 and 26 mPa.s as a 4% aqueous solution in water at 20° C.

The water-soluble overcoats are applied by means of surface coating methods known to the skilled practician such as doctor blade coating, roller coating, slot coating, curtain coating, spray or dipping processes. Depending on the use, basis weights of from 0.05 to 10 g/m² are suitable.

In many cases it is favorable to apply the water-soluble overcoats in an aqueous solution. This has the least detrimental effects on the environment and the human body.

For some applications, however, it can also be favorable to use organic solvents. In some substrates the addition of 0.5 to 60 wt.-% of an organic solvent to the aqueous coating solution improves adhesion. By means of a slight salvation of the substrate surface, the adhesive effect of the polymers of the overcoats according to the present invention is increased further. Such additives to solvents can e.g. be alcohols or ketones.

For a uniform and rapid wetting of the substrate surface to be coated, anionic, cationic or non-ionic wetting agents may be added to the coating solutions. The type and quantity are to be determined based on the recommendations made by the manufacturers of such wetting agents by means of suitable tests. The quality of the surface finish can furthermore be influenced by the addition of Theological additives such as flow improvers or thickeners such as e.g. hydroxymethyl cellulose, gelatin, gum arabic or polyvinylpyrrolidone.

In order to compensate for disturbing foam formation caused by components of the coating solution and turbulence as well as air in the coating process, foam separating substances such as silicone-containing compounds can be added to the coating solutions.

For some applications it is favorable to add dyes to the coating solutions for the preparation of the water-soluble overcoats according to the present invention. This can be done for optical reasons regarding the finished product, for the assessment of faults in the coating, but it can also have functional reasons such as the improvement of the image quality in photo structuring processes. The dyes can be added in a dissolved or finely dispersed form.

For certain uses the water-soluble overcoats can contain particles within the range of 0.05 to 50 μm, preferably 0.05 to 25 μm and particularly preferred 0.5 to 20 μm. This way, certain optical effects such as mattness, increased mechanical strength and improved contact with the film in vacuum printing frames can be achieved when used for printing plates. Such particles can consist of organic substances, preferably polymers, inorganic materials such as silicon dioxide, aluminum oxide etc. or inorganic substances modified organically at the surface.

Furthermore, the water-soluble overcoat according to the present invention can comprise one or more additional water-soluble polymers, stabilizers and/or preservatives.

Due to their favorable adhesion and high degree of oxygen-impermeability, the water-soluble overcoats according to the present invention proved to be especially suitable for protecting light-sensitive compositions on the basis of free radical photopolymerization. For this purpose, aqueous solutions of the water-soluble overcoats are preferably applied to the light-sensitive compositions.

The light-sensitive compositions comprise photo initiators which absorb in the range of 300 to 800 nm, free radical polymerizable components and optionally alkali-soluble binders and additives.

The parent substances or derivatives of acetophenones, benzophenones, (trichloromethyl)-1,3,5-triazines, benzoin compounds, benzoin ethers, benzoin ketones, xanthones, thioxanthones, acridines, or hexaarylbisimidazoles are especially suitable as photo initiators for the light-sensitive compositions of the present invention. Dyes can also be used as photoinitiators.

The free radical polymerizable component of the light-sensitive composition according to the present invention is an acrylic or methacrylic acid derivative having one or more unsaturated groups, preferably esters of the acrylic or methacrylic acid in the form of monomers, oligomers, or pre-polymers. It can be present in solid or liquid forms, wherein solid and viscous forms are preferred. Compounds suitable as monomers include e.g. trimethyloipropane triacrylate and methacrylate, pentaerythritol triacrylate and methacrylate, dipentaerythritol monhydroxy pentaacrylate and methacrylate, dipentaerythritol hexaacrylate and methacrylate, pentaerythritol tetraacrylate and methacrylate, di-trimethyloipropane tetraacrylate and methacrylate, di-ethyleneglycol diacrylate and methacrylate, triethyleneglycol diacrylate and methacrylate and tetraethyleneglycol diacrylate and methacrylate. Suitable oligomers and/or polymers are urethane acrylates and methacrylates, epoxy acrylates and methacrylates, polyester acrylates and methacrylates, polyether acrylates and methacrylates or unsaturated polyester resins.

The photo initiators and free radical polymerizable components are to be composed in the manners known to the person skilled in the art. Combinations of various photo initiators and different free radical polymerizable components can also be advantageous. The weight percentage of the photo initiators is preferably 0.5 to 20% and that of the free radical polymerizable components 5 to 80%, based on the total solids content of the light-sensitive compositions.

Furthermore, exposure indicators e.g. belonging to the triarylmethane dyes (such as Victoria China blue BO, Victoria blue R, crystal violet), azo dyes (such as 4-phenylazo-diphenyl-amine, 4-N,N-dimethylaminoazobenzene) or leuco dyes (e.g. triphenylmethane dyes such as leuco crystal violet or leuco malachite green) can be added to the light-sensitive compositions. The exposure indicators are usually present in the light-sensitive composition in an amount of from 0.02 to 10 wt.-%, preferably 0.5 to 6 wt.-%.

Dyes for increasing the contrast of the image can be added to the light-sensitive compositions; dyes which dissolve in the solvent or solvent mixture used for the coating or which may be added as a pigment in dispersed form are especially suitable. Suitable contrast dyes include, inter alia, triphenyl methane dyes, rhodamine dyes, anthraquinone pigments and phthalocyanine dyes and/or pigments.

The light-sensitive compositions can furthermore contain a plasticizer. Suitable plasticizers include inter alia, dibutylphthalate, triarylphosphate and dioctylphthalate. Dioctylphthalate is especially preferred. The plasticizer is preferably used in an amount of 0.25 to 2 wt.-%.

The water-soluble overcoats according to the present invention can preferably be used for the production of printing plates. Furthermore, however, they may also be used in recording materials for creating images on suitable carriers and receiving sheets, for creating reliefs that may serve as printing molds, screens and the like, as light hardenable varnishes for surface protection.

For producing planographic printing plates aluminum as the carrier is first roughened by brushing in the dry state, brushing with abrasive suspensions or electrochemically, e.g. in a hydrochloric acid electrolyte. The roughened plates, which were optionally anodically oxidized in sulfuric or phosphoric acid, are then subjected to a hydrophilizing aftertreatment, preferably in an aqueous solution of polyvinyl phosphoric acid, sodium silicate or phosphoric acid. The person skilled in the art is familiar with the details of the substrate pretreatment mentioned above.

The dried plates are then coated with the light-sensitive compositions of organic solvents or solvent mixtures such that dry layer weights in the range of preferably 0.5 to 4 g/m$^2$ more preferably 0.8 to 3 g/m$^2$, are obtained. Subsequently the coating is carried out with the water-soluble overcoat according to the present invention; the dry layer weight of the overcoat according to the present invention is preferably in the range of 0.05 to 10 g/m$^2$.

The thus produced printing plates are exposed in the usual manner known to the person skilled in the art. The water-soluble overcoat can be removed separately with water and, if necessary, mechanically by brushing prior to the developing step. However, there are also applications where the removal of the water-soluble overcoat is combined with the developing step. The developed plates are usually treated with a preservative ("rubber coating"). The preservatives are aqueous solutions of hydrophilic polymers, wetting agents and other additives.

For some applications it is furthermore advantageous to increase the mechanical strength of the printing layers by means of a heat treatment or the combined use of heat and UV radiation. For this purpose, prior to this treatment the plate is first treated with a solution that protects the non-image areas such that the heat treatment will cause no ink receptivity in these areas. A suitable solution is for example described in U.S. Pat. No. 4,355,096.

The invention is described in more detail by the following Examples.

Preparation Example 1

500 ml 1-vinylimidazole are added to 1,500 ml water in a three-neck flask. The solution is heated to 70° C. and washed with nitrogen for 15 minutes. Under stirring 43.2 g 2,2'-azobis(2-methylpropionamidine)dihydrochloride suspended in 20 ml water are added and the solution is refluxed for 1 h. Subsequently, a further 21.6 g 2,2'-azobis(2-methylpropionamidine)dihydrochloride is added and refluxed for another hour. Finally, 21.6 g 2,2'-azobis(2-methylpropionamidine)dihydrochloride are added and the mixture is heated to a temperature of 80° C. for two hours. The obtained solution of poly(1-vinylimidazole) has a solids content of about 20 wt.-% and can be used for the preparation of the overcoat solutions.

Preparation Example 2

2,000 ml hexane and 6,125 ml 2-butanone are mixed in a 10 l-three-neck flask and 781.25 g 1-vinylimidazole are added. Under stirring and washing with nitrogen the solution is brought co a boil and 42.5 g azobisisobutyronitrile suspended in 20 ml hexane are added. After only a brief reaction time, a polymer starts to form as a white precipitate. After one hour of refluxing, a further 21.25 g azobisisobutyronitrile are added. After one hour of refluxing, 21.25 g azobisisobutyronitrile are again added. Finally, the solution is refluxed for two hours. Then the solution is allowed to cool to room temperature and the produced is filtered off. The filtration residue is suspended twice in hexane and filtered. Then the product is dried at 40° C. in a circulating air drying-cabinet. The yield is 671 g.

Preparation Example 3

80 ml 1-vinylimidazole and 20 ml vinylacetate are dissolved in 500 ml water. The solution is heated to 70° C. while nitrogen is introduced and after the temperature has been reached, 8.6 g 2,2-azobis(2-methylpropionamidine) dihydrochlorid in 20 ml water are added. After one hour a further 4.32 g 2,2-azobis(2-methylpropionamidine) dihydrochlorid are added. After one hour 4.32 g 2,2-azobis (2-methylpropionamidine)dihydrochlorid are again added and the solution is stirred at a temperature of 70° C. for an additional two hours. 42.4 g of a polymeric product are obtained after the addition of acetone, washing with acetone and drying at 40° C. In the infrared spectrum the incorporation of the vinylacetate groups can be observed with reference to the carbonyl bands.

Preparation Example 4

200 ml hexane and 600 ml 2-butanone are mixed in a 2 l three-neck flask and 62.5 g 1-vinylimidazole and 16.4 g vinylmethylacetamide are added. Under stirring and washing with nitrogen the solution is brought to a boil and 4.25 g azobisisobutyronitrile suspended in 5 ml hexane are added. After only a brief reaction time, a polymer starts to form as a white precipitate. After one hour of refluxing, a further 2.1 g azobisisobutyronitrile are added. After one hour of refluxing, 2.1 g azobisisobutyronitrile are again added. Finally, the solution is heated under reflux for two hours. Then the solution is allowed to cool to room temperature and the produced is filtered off. The filtration residue is suspended twice in hexane and filtered. Then the product is dried at 40° C. in a circulating air drying-cabinet. The yield is 39.3 g.

EXAMPLE 1

A solution of a light-sensitive composition is prepared from the following components:

2.1 g of a terpolymer obtained by polymerization of 476 parts by weight styrene, 476 parts by weight methyl methacrylate and 106 parts by weight methacrylic acid.

5.24 g of an 80% methylethylketone solution of an urethane acrylate obtained by reacting Desmodur N100® (available from the company Bayer) with hydroxy ethyl acrylate and pentaerythritol triacrylate with a content of double bonds of 0.5 double bonds/100 g after complete reaction of the isocyanate groups 1.29 g dipentaerythritol pentaacrylate 0.6 g 2,4-trichloromethyl-6[(4-ethoxyethyleneoxy) naphthyl]1,3,5-triazine 0.16 g 4,4'-N,N-diethyl-amino-benzophenone 0.2 g benzophenone 0.19 g 3-mercapto-1,2,4-thiazole 0.12 g Renol blue B2G-HW® (copper phthalocyanine pigment dispersed in polyvinyl butyral, available from the company Hoechst)

0.1 g leuco crystal violet

These components are dissolved under stirring in 100 ml of a mixture comprising 35 parts by volume methyl glycol 25 parts by volume methanol 40 parts by volume methyl ethyl ketone After filtering, the solution is applied to an electrochemically roughened and anodized aluminum foil that was subjected to an aftertreatment using an aqueous solution of polyvinyl phosphonic acid by means of common methods and the layer is dried for 5 min at 90° C. The dry weight of the printing layer amounts to approx. 2.2 g/m$^2$.

Subsequently, the overcoat having a dry layer weight of 1.7 g/m$^2$ is applied analogously by applying a coating of an aqueous solution of the following composition:

10 g of the 20 wt.-% poly(1-vinylimidazole) solution of Preparation Example 1

82 g water and 8 g polyvinyl alcohol (Airvol 203, available from the company Airproducts, residual content of acetyl groups 12 mol-%).

Drying also takes place for 5 min at 90° C.

In order to assess the adhesive strength, an adhesive tape is pressed onto the water-soluble overcoat. When this adhesive tape is pulled off, the overcoat is not damaged.

The printing layer is exposed under a silver film halftone step wedge having a tonal range of 0.15 to 1.95, wherein the density increments amount to 0.15, to give a negative model by means of a metal halide lamp (MH burner, available from the company Sack) with 10 mJ/cm$^2$.

The exposed layer is treated for 30 seconds with a developer solution comprising 3,4 parts by weight Rewopol NLS 28® (REWO)

1,8 parts by weight 2-phenoxy ethanol 1,1 parts by weight diethanol amine 1,0 parts by weight Texapon 842® (Henkel)

0,6 parts by weight Nekal BX Paste® (BASF)

0,2 parts by weight 4-toluene sulfonic acid 91,9 parts by weight water.

Then the developer solution is again rubbed over the surface for another 30 seconds with a tampon and then the entire plate is rinsed with water. After this treatment, the exposed portions remain on the plate. For the assessment of light-sensitivity the plate is blackened in a wet state using a printing ink.

The ink receptivity of the plate is good and exposed microscopic lines are very well reproduced. The gray wedge is completely covered up to step 4 and partially covered up to step 7.

If between exposure and development the plates are left in the dark at room temperature for 30 minutes, the same gray wedge is obtained.

For the preparation of a printing plate, a printing layer is applied to the aluminum foil, as explained above, exposed, developed and after rinsing with water the developed plate is knife-coated and rubbed with an aqueous solution of 0.5% phosphoric acid and 6% gum arabic. The thus prepared plate is positioned in a sheet-fed offset printing machine. Think receptivity of the plate immediately after the beginning of the printing process is good. Under normal printing conditions 200,000 high-quality copies can be obtained. The plate could be used for more prints.

To simulate ageing of the plates, they are stored for 10 days at a temperature of 40° C. and 80% relative humidity. Then the plates exposed and developed as described above are used for printing in a sheet-fed offset printing machine Their printing behavior does not differ from that of plates that were not artificially aged.

EXAMPLE 2

The same light-sensitive layer as in Example 1 is used.

For preparing the water-soluble overcoat, the following mixture is applied:

2 g poly(1-vinylimidazole) from Preparation Example 2

8 g polyvinyl alcohol (Airvol 203, available from the company Airproducts, residual content of acetyl groups 12 mol-%)

90 g water

Drying also takes place for 5 min at 95° C.

The assessment of the adhesive strength of the water-soluble overcoat and the exposure and development of the printing plate is carried out as described in Example 1.

The adhesion of the overcoat is good. The ink receptivity of the plate is good and exposed microscopic lines are very well reproduced. The gray wedge is completely covered up to step 4 and partially covered up to step 7. If between exposure and development the plates are left in the dark at room temperature for 30 minutes, the same gray wedge is obtained. In a printing test, 200,000 high-quality copies are obtained. After this number of copies, the printing plates were not worn and could have been used for further printing.

EXAMPLE 3

A solution of a light-sensitive composition is prepared from the following components:
3.5 g of a 70% solution of a polymer obtained by the polymerization of 20 parts by weight ethyl methacrylate, 30 parts by weight methyl methacrylate, 20 parts by weight hydroxyethyl methacrylate and 10 parts by weight methacrylic acid
1.92 g of an aliphatic urethane acrylate (Ebecryl 8301, available from the company UCB)
0.26 g ditrimethylol propane tetraacrylate (Sartomer 355, available from the company Cray Valley)
0.34 g 2,4-trichloromethyl-6[(4-ethoxyethyleneoxy) naphthyl]1,3,5-triazine
0.1 g 3-mercapto-1,2,4-triazole
0.07 g Renol blue B2G-HW® (copper phthalocyanine pigment dispersed in polyvinyl butyral, available from the company Hoechst)
0.08 g leuco crystal violet
and a printing layer is prepared as described in Example 1. The water-soluble overcoat of Example 1 is used.

The assessment o the adhesive strength of the water-soluble overcoat and the exposure and development of the printing plate is carried out as described in Example 1.

The adhesion of the overcoat and the ink receptivity of the plate are good and exposed microscopic lines are very well reproduced. The gray wedge is completely covered up to step 4 and partially covered up to step 7. If between exposure and development the plates are left in the dark for 30 minutes, the same gray wedge is obtained. In a printing test, 200,000 high-quality copies are obtained. After this number of copies, the printing plates were not worn and could have been used for further printing.

EXAMPLE 4

The same light-sensitive layer as in Example 1 is used.
For preparing the water-soluble overcoat, the following mixture is applied:
2 g PVI copolymer from Preparation Example 3
8 g polyvinyl alcohol (Airvol 203, available from the company Airproducts, residual content of acetyl groups 12 mol-%)
90 g water
Drying takes place for 5 min at 95° C.

The assessment of the adhesive strength of the water-soluble overcoat and the exposure and development of the printing plate is carried out as described in Example 1.

The adhesion of the overcoat is good. The ink receptivity of the plate is good and exposed microscopic lines are very well reproduced. The gray wedge is completely covered up to step 4 and partially covered up to step 7. If between exposure and development the plates are left in the dark for 30 minutes, a gray wedge is obtained which is completely covered up to step 3 and partially covered up to step 6. In a printing test, 200,000 high-quality copies are obtained. After this number of copies, the printing plates were not worn and could have been used for further printing.

EXAMPLE 5

The same light-sensitive layer as in Example 1 is used.
For preparing the water-soluble overcoat, the following mixture is applied:
2 g PVI copolymer from Preparation Example 4
8 g polyvinyl alcohol (Airvol 203, available from the company Airproducts, residual content of acetyl groups 12 mol-%)
90 g water
Drying takes place for 5 min at 95° C.

The assessment of the adhesive strength of the water-soluble overcoat and the exposure and development of the printing plate is carried out as described in Example 1.

The adhesion of the overcoat is good. The ink receptivity of the plate is good and exposed microscopic lines are very well reproduced. The gray wedge is completely covered up to step 4 and partially covered up to step 7. If between exposure and development the plates are left in the dark for 30 minutes, a gray wedge is obtained which is completely covered up to step 2 and partially covered up to step 7. In a printing test, 200,000 high-quality copies are obtained. After this number of copies, the printing plates were not worn and could have been used for further printing.

Comparative Example 1

The same light-sensitive layer as in Example 1 is used.
For preparing the water-soluble overcoat, the following mixture is applied:
50 g polyvinyl alcohol (Airvol 203 available from the company Airproducts, residual content of acetyl groups 12 mol-%)
500 g water
Drying takes place for 5 min at 95° C.

The assessment of the adhesive strength of the water-soluble overcoat and the exposure and development of the printing plate is carried out as described in Example 1.

The adhesion of the overcoat is very poor. The adhesive tape removes almost the entire areas to which the tape adhered. At the cutting edges the water-soluble overcoat peels off.

The ink receptivity of the plate and the reproduction of the exposed microscope lines are not objectionable.

Comparative Example 2

Corresponding to EP-A-352 630

The same light-sensitive layer as in Example 1 is used.
For preparing the water-soluble overcoat, the following mixture is applied:
45 g polyvinyl alcohol (Airvol 203, available from the company Airproducts, residual content of acetyl groups 12 mol-%)
5 g Polymin P (polyethylene imine available from the company BASF)
500 g water
Drying takes place for 5 min at 95° C.

The assessment of the adhesive strength of the water-soluble overcoat and the exposure and development of the printing plate is carried out as described in Example 1.

The adhesion of the overcoat, the ink receptivity of the fresh plate and the reproduction of the exposed microscopic lines are not objectionable. The plates, which were subjected to simulated ageing at a temperature of 40° C. and 80% relative humidity for 10 days, show a poor ink receptivity in particular in overexposed areas, which does not improve after a larger number of copies has been printed.

Comparative Example 3

Corresponding to U.S. Pat. No. 3,458,311

The same light-sensitive layer as in Example 1 is used.

For preparing the water-soluble overcoat, the following mixture is applied:

50 g polyvinyl alcohol (Airvol 203, available from the company Airproducts, residual content of acetyl groups 12 mol-%)
450 g water
50 g ethanol Drying takes place for 5 min at 95° C.

The assessment of the adhesive strength of the water-soluble overcoat and the exposure and development of the printing plate is carried cut as described in Example 1.

The adhesion of the overcoat is poor. Large areas are removed together with the adhesive tape.

During mechanical coating by means of dipping rolls yellow components of the light-sensitive layer accumulate in the dipping bath of the overcoat solution.

The ink receptivity of the plate is good, but exposed microscopic lines are not completely reproduced.

Comparative Example 4

Corresponding to U.S. Pat. No. 4,072,527

The same light-sensitive layer as in Example 1 is used.

For preparing the water-soluble overcoat, the following mixture is applied:

40 g polyvinyl alcohol (Airvol 203 available from the company Airproducts, residual content of acetyl groups 12 mol-%)
30 g of a 30% dispersion of a terpolymer obtained from 66 wt.-% methyl methacrylate, 29 wt.-% ethyl acrylate and 5 wt.-% methacrylic acid in a mixture of 90 wt.-% water and 10 wt.-% ethyleneglycol monomethylether
480 g water Drying takes place for 5 min at 95° C.

The assessment of the adhesive strength of the water-soluble overcoat and the exposure and development of the printing plate is carried out as described in Example 1.

The adhesion of the overcoat is very poor. The adhesive tape removes almost the entire areas to which the tape adhered. At the cutting edges the water-soluble overcoat peels off.

The ink receptivity of the plate and the reproduction of the exposed microscopic lines are not objectionable. The gray wedge is completely covered up to step 3 and partially covered up to step 6. However, if between exposure and development the plates are left in the dark for 30 minutes, no image remains after development. Therefore, it can be concluded that she overcoat has a low degree of oxygen impermeability. Furthermore, plates which were subjected to simulated ageing at a temperature of 40° C. and 80% relative humidity for 10 days, show an extension of the gray wedge by 4 steps.

Moreover, in the case of artificially aged plates, the non-image areas are not completely clean but show a tendency towards ink receptivity in some areas.

Comparative Example 5

Corresponding to EP-A-275 147

The same light-sensitive layer as in Example 1 is used.

For preparing the water-soluble overcoat, the following mixture is applied:

48.5 g polyvinyl alcohol (Airvol 203 available from the company Airproducts, residual content of acetyl groups 12 mol-%)
1.5 g glycin
500 g water Drying takes place for 5 min at 95° C.

The assessment of the adhesive strength of the water-soluble overcoat and the exposure and development of the printing plate is carried out as described in Example 1.

The adhesion of he overcoat is very poor. The adhesive tape removes almost the entire areas to which the tape adhered. At the cutting edges the water-soluble overcoat peels off.

The ink receptivity of the plate and the reproduction of the exposed microscopic lines are not objectionable. The gray wedge is completely covered up to step 4 and partially covered up to step 7.

What is claimed is:

1. A lithographic printing plate precursor comprising a substrate, a free radical polymerizable photosensitive layer comprising a light-sensitive composition, and a water-soluble overcoat layer coated onto the photosensitive layer, wherein the overcoat layer comprises polyvinyl alcohol and a component that is poly(1-vinylimidazole) or a copolymer consisting of units of 1-vinylimidazole and at least one monomer selected from the group consisting of vinylpyrrolidone, vinyl alcohol, vinyl acetate, vinylalkylether, hydroxyalkylacrylate, vinyl acetamide, vinyl formamide, acrylonitrile, acrylamide, methacrylamide and vinylamine.

2. The precursor according to claim 1 wherein the component is a copolymer having a content of 1-vinylimidazole of 10 to 98 mol-%.

3. The precursor according to claim 1 wherein the overcoat layer comprises a content of the component of 5 to 80 wt.-% based on the dry weight of the overcoat layer.

4. The precursor according to claim 1 wherein the overcoat layer comprises a polyvinyl alcohol, wherein the polyvinyl alcohol has a residual acetate group content of 0.1 to 30 wt.-%.

5. The precursor according to claim 1 wherein the overcoat layer comprises at least one further component selected from the group consisting of a further water-soluble polymer, a wetting agent, a rheological additive, a foam separator, a dyeing agent, a stabilizer and a preservative.

6. The precursor of claim 1, wherein the photosensitive layer comprises at least one free radical-forming photo initiator or at least one mixture of photo initiators and coinitiators that sensitize the photosensitive layer for the wave lengths of 300 to 800 nm, at least one alkali-soluble, carboxyl group-containing binder, free radically polymerizable components having unsaturated groups and optionally further additives.

7. An overcoat for a free radical polymerizable photosensitive layer comprising light-sensitive compositions, wherein the overcoat comprises a water-soluble layer comprising polyvinyl alcohol and a component that is poly(1-vinylimidazole) or a copolymer consisting of units of 1-vinylimidazole and at least one monomer selected from the group consisting of vinylpyrrolidone, vinyl alcohol, vinyl acetate, vinylalkylether, hydroxyalkylacrylate vinyl acetamide, vinyl formamide, acrylonitrile, acrylamide, methacrylamide and vinylamine.

8. The overcoat of claim 7, wherein said overcoat has a dry layer weight of 0.05 to 10 g/m$^2$.

9. The overcoat of claim 7 wherein the light-sensitive composition is the light-sensitive layer of printing plates.

10. The precursor of claim 1, wherein the photosensitive layer comprises a free radical polymerizable component and a photoinitiator.

11. The precursor of claim 10, wherein the free radical polymerizable component is an acrylic or methacrylic acid derivative having one or more unsaturated groups.

12. The precursor of claim 11, wherein the free radical polymerizable component is an acrylic acid ester or a methacrylic acid ester.

13. The precursor of claim 12, wherein the acrylic acid ester or methacrylic acid ester is in the form of a monomer, oligomer, or prepolymer.

14. The precursor of claim 10, wherein the free radical polymerizable component is selected from the group consisting of trimethylolpropane triacrylate and methacrylate, pentaerythritol triacrylate and methacrylate, dipentaerythritol monhydroxy pentaacrylate and methacrylate, dipentaerythritol hexaacrylate and methacrylate, pentaerythritol tetraacrylate and methacrylate, di-trimethylolpropane tetraacrylate and methacrylate, diethyleneglycol diacrylate and methacrylate, triethylene-glycol diacrylate and methacrylate, tetraethyleneglycol diacrylate and methacrylate, urethane acrylate and methacrylate, epoxy acrylate and methacrylate, polyether acrylate and methacrylate, and unsaturated polyester resins.

15. The precursor of claim 10, wherein the photoinitiator is selected from the group consisting of acetophenones, benzophenones, (trichloromethyl)-1,3,5-triazines, benzoin compounds, xanthones, thioxanthones, acridines, and hexaarylbisimidazoles.

16. The precursor of claim 10, wherein the photoinitiator is a dye.

17. The precursor of claim 1, in which the component is a copolymer consisting of units of 1-vinylimidazole and vinyl acetate.

18. The overcoat of claim 10, in which the component is a copolymer consisting of units of 1-vinylimidazole and vinyl acetate.

19. A water-soluble overcoat layer coated onto a photosensitive layer, wherein the overcoat layer comprises polyvinyl alcohol and a component that is poly(1-vinylimidazole) or a copolymer consisting of units of 1-vinylimidazole and at least one monomer selected from the group consisting of vinylpyrrolidone, vinyl alcohol, vinyl acetate, vinylalkylether, hydroxyalkylacrylate, vinyl acetamide, vinyl formamide, acrylonitrile, acrylamide, methacrylamide and vinylamine.

20. The overcoat layer of claim 19 wherein the component is a copolymer having a content of 1-vinylimidazole of 10 to 98 mol-%.

21. The overcoat layer of claim 19 wherein the overcoat layer comprises a content of the component of 5 to 80 wt-% based on the dry weight of the overcoat layer.

22. The overcoat layer of claim 19 wherein the polyvinyl alcohol has a residual acetate group content of 0.1 to 30 wt-%.

23. The overcoat layer of claim 19 wherein the overcoat layer comprises at least one further component selected from the group consisting of a further water-soluble polymer, a wetting agent, a rheological additive, a foam separator, a dyeing agent, a stabilizer and a preservative.

24. The overcoat layer of claim 19, wherein the photosensitive layer comprises at least one free radical-forming photo initiator or at least one mixture of photo initiators and coinitiators that sensitize the photosensitive layer for the wave lengths of 300 to 800 nm, at least one alkali-soluble, carboxyl group-containing binder, free radically polymerizable components having unsaturated groups and optionally further additives.

25. The overcoat layer of claim 19, wherein the photosensitive layer comprises a free radical polymerizable component and a photoinitiator.

26. The overcoat layer of claim 25, wherein the free radical polymerizable component is an acrylic acid ester or a methacrylic acid ester.

27. The overcoat layer of claim 25, wherein the free radical polymerizable component is selected from the group consisting of trimethylolpropane triacrylate and methacrylate, pentaerythritol triacrylate and methacrylate, dipentaerythritol monohydroxy pentaacrylate and methacrylate, dipentaerythritol hexaacrylate and methacrylate, pentaerythritol tetraacrylate and methacrylate, di-trimethylolpropane tetraacrylate and methacrylate, diethyleneglycol diacrylate and methacrylate, triethylene-glycol diacrylate and methacrylate, tetraethyleneglycol diacrylate and methacrylate, urethane acrylate and methacrylate, epoxy acrylate and methacrylate, polyether acrylate and methacrylate, and unsaturated polyester resins.

28. The overcoat layer of claim 25, wherein the photoinitiator is selected from the group consisting of acetophenones, benzophenones, (trichloromethyl)-1,3,5-triazines, benzoin compounds, xanthones, thioxanthones, acridines, and hexaarylbisimidazoles.

29. The overcoat layer of claim 19, in which the component is a copolymer consisting of units of 1-vinylimidazole and vinyl acetate.

30. The precursor of claim 5, wherein the benzoin compounds are selected from the group consisting of benzoin ethers and benzoin ketones.

31. The overcoat layer of claim 28, wherein the benzoin compounds are selected from the group consisting of benzoin ethers and benzoin ketones.

32. The precursor of claim 1, in which the component is poly(1-vinylimidazole).

33. The overcoat of claim 7, in which the component is poly(1-vinylimidazole).

34. The overcoat layer of claim 19, in which the component is poly(1-vinylimidazole).

35. A lithographic printing plate precursor comprising a substrate, a free radical polymerizable photosensitive layer comprising a light-sensitive composition, and a water-soluble overcoat layer coated onto the photosensitive layer, wherein the overcoat layer comprises polyvinyl alcohol and a component that is a copolymer consisting of units of 1-vinylimidazole and vinylmethylacetamide.

36. An overcoat for a free radical polymerizable photosensitive layer comprising light-sensitive compositions, wherein the overcoat comprises a water-soluble layer comprising polyvinyl alcohol and a component that is a copolymer consisting of units of 1-vinylimidazole and vinylmethylacetamide.

37. A water-soluble overcoat layer coated onto a photosensitive layer, wherein the overcoat layer comprises polyvinyl alcohol and a component that is a copolymer consisting of units of 1-vinylimidazole and vinylmethylacetamide.

38. The precursor according to claim 1 wherein the overcoat layer further comprises a solid having particle sizes between 0.05 and 50 μm.

39. The overcoat layer of claim 19 wherein the overcoat layer further comprises a solid having particle sizes between 0.05 and 50 μm.

* * * * *

UNITED STATES PATENT AND TRADEMARK OFFICE
CERTIFICATE OF CORRECTION

PATENT NO.    : 6,649,323 B2
DATED         : November 18, 2003
INVENTOR(S)   : Socrates Peter Pappas et al.

It is certified that error appears in the above-identified patent and that said Letters Patent is hereby corrected as shown below:

Column 12,
Line 61, after "hydroxyalkylacrylate" insert a comma

Column 13,
Line 36, delete "10" and insert therefor -- 7 --

Column 14,
Line 31, delete "5" and insert therefor -- 15 --

Signed and Sealed this

Sixth Day of April, 2004

JON W. DUDAS
*Acting Director of the United States Patent and Trademark Office*